(12) United States Patent
Ray et al.

(10) Patent No.: US 7,029,805 B2
(45) Date of Patent: *Apr. 18, 2006

(54) IMAGEABLE ELEMENT WITH MASKING LAYER COMPRISING BETAINE-CONTAINING CO-POLYMERS

(75) Inventors: Kevin Ray, Fort Collins, CO (US); Ting Tao, Fort Collins, CO (US); Scott Beckley, Windsor, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/935,524

(22) Filed: Sep. 7, 2004

(65) Prior Publication Data

US 2006/0051700 A1   Mar. 9, 2006

(51) Int. Cl.
*G03F 1/10* (2006.01)
*G03F 7/038* (2006.01)
*G03F 7/30* (2006.01)

(52) U.S. Cl. .................. 430/5; 430/270.1; 430/273.1; 430/302; 430/306; 430/330; 430/910; 430/964

(58) Field of Classification Search ............. 430/270.1, 430/302, 306, 273.1, 330, 910, 5, 964
See application file for complete search history.

(56) References Cited

U.S. PATENT DOCUMENTS

| | | | |
|---|---|---|---|
| 5,262,275 A | 11/1993 | Fan | |
| 5,478,690 A * | 12/1995 | Kanda et al. | 430/175 |
| 5,512,418 A * | 4/1996 | Ma | 430/271.1 |
| 5,705,310 A | 1/1998 | Van Zoeren | |
| 5,719,009 A | 2/1998 | Fan | |
| 5,912,105 A | 6/1999 | Haberhauer et al. | |
| 6,063,546 A | 5/2000 | Gelbart | |
| 6,190,830 B1 * | 2/2001 | Leon et al. | 430/270.1 |
| 6,238,837 B1 | 5/2001 | Fan | |
| 6,312,872 B1 | 11/2001 | Murphy et al. | |
| 6,367,381 B1 | 4/2002 | Kanga | |
| 6,413,699 B1 | 7/2002 | Kanga | |
| 6,472,121 B1 | 10/2002 | Murphy et al. | |
| 6,521,390 B1 | 2/2003 | Leinenbach et al. | |
| 6,558,876 B1 | 5/2003 | Fan | |
| 6,599,679 B1 | 7/2003 | Philipp et al. | |
| 6,605,410 B1 | 8/2003 | Yang et al. | |
| 2001/0053498 A1 | 12/2001 | Fujimoto et al. | |
| 2002/0115019 A1 | 8/2002 | Kaczun et al. | |
| 2002/0197540 A1 | 12/2002 | Goodin et al. | |
| 2003/0129533 A1 | 7/2003 | Goodin et al. | |

FOREIGN PATENT DOCUMENTS

JP    2001-260551    9/2001

* cited by examiner

*Primary Examiner*—Richard L. Schilling

(57) ABSTRACT

Thermally imageable elements comprising a masking layer and a substrate are disclosed. The masking layer contains a sulfobetaine and/or a carboxybetaine containing co-polymer or a mixture of a sulfobetaine and/or a carboxybetaine containing co-polymers and absorbs both infrared and ultraviolet radiation. When the masking layer is on the substrate, the imageable element may be imaged and developed to form a photomask. When the imageable element additionally comprises a photosensitive layer, the masking layer may be imaged and developed to form an integral photomask. The imageable elements that comprise a photosensitive layer are useful as flexographic printing plate precursors.

32 Claims, No Drawings

US 7,029,805 B2

IMAGEABLE ELEMENT WITH MASKING LAYER COMPRISING BETAINE-CONTAINING CO-POLYMERS

FIELD OF THE INVENTION

The invention relates to imageable elements that comprise a masking layer and a substrate. In particular, it relates to thermally imageable elements in which the masking layer comprises a sulfobetaine and/or a carboxybetaine containing co-polymer.

BACKGROUND OF THE INVENTION

Flexographic printing plates are used in letterpress printing, particularly on surfaces which are soft and easily deformable, such as packaging materials, e.g., cardboard, paper, and plastic packaging films. Flexographic printing plates can be prepared from imageable elements that comprise a photosensitive layer on a substrate. The element is imaged with ultraviolet and/or visible radiation and then developed with a suitable developer leaving a printing relief, which can be used for flexographic printing. If after exposure to radiation the exposed regions of the photosensitive layer are removed in the developing process, the element is referred to as "positive working." Conversely, if the developing process removes the unexposed regions and the exposed regions remain, the element is "negative working." Elements useful as flexographic printing plate precursors are typically negative working, but need not be so.

Imaging of the imageable element with ultraviolet and/or visible radiation is typically carried out through a mask, which has clear and opaque regions. Imaging takes place in the regions of the photosensitive layer under the clear regions of the mask but does not occur in the regions of the photosensitive layer under the opaque regions of the mask. For negative working systems, the mask is usually a photographic negative of the desired image. If corrections are needed in the final image, a new mask must be made. This is a time-consuming process. In addition, the mask may change slightly in dimension due to changes in temperature and humidity. Thus, the same mask, when used at different times or in different environments, may give different results and could cause registration problems.

Direct digital imaging of printing plate precursors, which obviates the need for exposure through a mask, is becoming increasingly important in the printing industry. In these processes, a computer controlled laser scans and images the photosensitive layer of the printing plate precursor. However, it has not typically been practical to use lasers to image flexographic printing plate precursors, which have relatively thick photosensitive layers. These elements have low photosensitivity and require long exposure times even with high-powered lasers. In addition, most of the imageable materials used in these elements have their greatest sensitivity in the ultraviolet region of the spectrum. Although ultraviolet emitting lasers are known, economical and reliable ultraviolet lasers with high power are not readily available. However, relatively inexpensive infrared lasers that have a useful power output are readily available.

Flexographic printing plate precursors that comprise a layer that is ablatable by infrared radiation have been used to form an integral mask over the photosensitive layer, thereby providing the advantages of direct digital imaging. The masking layer is imaged with an infrared laser and the resulting element exposed with ultraviolet and/or visible radiation through the mask. However, because ablation produces debris, the filmsetter used to image ablative masks requires additional filtration systems to prevent the debris from contaminating the optics of the filmsetter. In addition, some of the ablatable layers require large amounts of expensive infrared absorbers.

Thus, a need exists for imageable elements useful as flexographic printing plate precursors that provide the advantages of direct digital imaging but do not exhibit some or all of the disadvantages of laser exposure suffered by existing methods.

SUMMARY OF THE INVENTION

In one aspect, the invention is an imageable element useful as a printing plate precursor. The imageable element comprises, in order:
a substrate,
a photosensitive layer, the photosensitive layer comprising a photosensitive composition, and
a masking layer comprising a radiation absorber and one or more co-polymers selected from the group consisting of co-polymers that comprises sulfobetaine containing side chains, co-polymers that comprise carboxybetaine containing side chains, and co-polymers that comprise sulfobetaine containing side chains and carboxybetaine containing side chains;
wherein:
the radiation absorber comprises one or more materials selected from the group consisting of materials that absorb ultraviolet radiation, photothermal conversion materials, photothermal conversion materials that also absorb ultraviolet radiation, and mixtures thereof; and
the masking layer absorbs ultraviolet radiation and infrared radiation.

The support is preferably flexible and, more preferably, transmits visible and/or ultraviolet radiation. The element may additionally comprise a barrier layer between the photosensitive layer and the masking layer.

In another aspect, the one or more co-polymers comprise K units and L units in which:
the K units are selected from $-[CH_2C(R^1)R^2]-$, $-[CH_2CR^3(CO_2R^4)]-$, $-[CH_2CR^3(CON(R^5)(R^6))]-$, $-[C(R^7)(COECO)C(R^7)]-$, and mixtures thereof;
the L units are selected from $-[CH_2C(R^8)(Q(CH_2)_mN(CH_3)_2(CH_2)_nSO_3)]-$, $-[CH_2C(R^9)(Q(CH_2)_mN(CH_3)_2(CH_2)_nCO_2)]-$, and mixtures thereof;
$R^1$, $R^3$, $R^7$, $R^8$, and $R^9$, are each independently hydrogen, methyl, or a mixture thereof;
$R^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;
$R^4$, $R^5$, and $R^6$ are each independently hydrogen, alkyl of one to six carbon atoms, cycloalkyl of one to six carbon atoms, phenyl, or a mixture thereof;
E is oxygen or $NR^{10}$ in which $R^{10}$ is hydrogen, hydroxyl, phenyl, substituted phenyl, alkyl of one to six carbon atoms, benzyl, or a mixture thereof;
each Q is independently $CO_2$, O, CONH, $CH_2$, or a mixture thereof;
m is 1 to 8;
n is 2 to 4; and
the ratio of K units to L units is about 99:1 to about 1:99.

In another aspect, the invention is a method for forming an image useful as a flexographic printing plate, the method comprising the steps of, in order: thermally imaging and developing the masking layer and forming a photomask; overall exposing the photosensitive layer through the photomask and forming an imaged photosensitive layer comprising imaged and complementary unimaged regions in the photosensitive layer; removing the photomask; and developing the imaged photosensitive layer and forming the image by removing one of the imaged regions and the unimaged regions.

DETAILED DESCRIPTION OF THE INVENTION

Unless the context indicates otherwise, in the specification and claims, the terms a co-polymer, sulfobetaine containing co-polymer, carboxybetaine containing co-polymer, radiation absorber, photothermal conversion material, material that absorbs ultraviolet radiation, binder, surfactant, coating solvent, and similar terms also include mixtures of such materials. Thermal imaging refers to imaging with a hot body, such as a thermal head, or with infrared radiation. Unless otherwise specified, all percentages are percentages by weight and all temperatures are in ° C.

Imageable Elements

The imageable element comprises, in order, a substrate and a thermally imageable masking layer. The masking layer comprises a sulfobetaine and/or a carboxybetaine co-polymer and a radiation absorber. The masking layer may be on the substrate, or there may be one or more layers between the substrate and the masking layer. Typically, a photosensitive layer is between the substrate and the thermally imageable masking layer. The photosensitive layer comprises a positive or negative working photosensitive composition, typically a photopolymerizable composition. An optional barrier layer and/or an optional cover sheet may also be present.

Substrate

The substrate comprises a support, which may be any material conventionally used to prepare imageable elements useful as printing plate precursors. The support is preferably strong and stable. It should resist dimensional change under conditions of use so that color records will register in a full-color image. For use in flexographic printing, the substrate is preferably flexible for good contact during printing. Suitable supports include polymeric films such as polyester, polystyrene, polyethylene, polypropylene, polycarbonate, polyamide, and fluoropolymers. A preferred support is a polyester film; particularly preferred is polyethylene terephthalate. The support is typically about 0.0051 to 0.025 cm thick, preferably about 0.0076 to 0.020 cm thick. When the imageable element requires a backflash exposure, the substrate must transmit the radiation used for the backflash exposure, typically ultraviolet and/or visible radiation. When the masking layer is on the substrate and the imaged and developed imageable element is to be used as a photomask, the substrate must transmit the radiation to be used to expose through the mask, typically ultraviolet and/or visible radiation. Typically, at least 80%, and preferably 90%, of the radiation is transmitted in each case.

The substrate may also comprise a subbing layer over the surface of the support adjacent to the photosensitive layer and an antihalation layer or layers on either or both surfaces of the support.

Photosensitive Layer

The photosensitive layer, which, when present, is over the substrate, comprises a layer of a photosensitive composition. Either a positive working or a negative working photosensitive composition may be used. In particular, numerous negative working photosensitive compositions are known for use in the photosensitive layer of flexographic printing plate precursors. Suitable examples include negative-working, ultraviolet and/or visible sensitive, photopolymerizable compositions such as are known in the art. These compositions typically comprise an elastomeric binder, at least one free-radical polymerizable monomer, and a photoinitiator that is sensitive to ultraviolet and/or visible radiation. Examples of suitable photocompositions have been disclosed, for example, in Chen, U.S. Pat. No. 4,323,637; Gruetzmacher, U.S. Pat. No. 4,427,759; and Feinberg, U.S. Pat. No. 4,894,315.

The elastomeric binder can be a single polymer or mixture of polymers that are soluble, swellable, or dispersible in aqueous, semi-aqueous, or organic solvent developers. Binders that are soluble or dispersible in aqueous or semi-aqueous developers have been disclosed in Alles, U.S. Pat. No. 3,458,311; Pohl, U.S. Pat. No. 4,442,302; Pine, U.S. Pat. No. 4,361,640; Inoue, U.S. Pat. No. 3,794,494; Proskow, U.S. Pat. No. 4,177,074; Proskow, U.S. Pat. No. 4,431,723; and Worns, U.S. Pat. No. 4,517,279. Elastomeric binders that are soluble, swellable or dispersible in organic solvent developers include natural or synthetic polymers of conjugated diolefin hydrocarbons, including polyisoprene, poly(1,2-butadiene), poly(1,4-butadiene), butadiene/acrylonitrile, polystyrene-polybutadiene-polystyrene thermoplastic-elastomeric block co-polymers, polystyrene-polyisoprene-polystyrene thermoplastic-elastomeric block co-polymers, and other co-polymers. The block co-polymers discussed in Chen, U.S. Pat. No. 4,323,636; Heinz, U.S. Pat. No. 4,430,417; and Toda, U.S. Pat. No. 4,045,231 can be used. The binder preferably comprises at least 65% by weight of the photosensitive composition. Core shell microgels and blends of microgels and preformed macromolecular polymers, such as those disclosed in Fryd, U.S. Pat. No. 4,956,252, may also be used.

The photosensitive composition comprises a free-radical polymerizable monomer or mixture of free-radical polymerizable monomers. The monomer or monomers must be compatible with the binder and the other ingredients to the extent that a clear, non-cloudy photosensitive layer is produced. Monomers are well known in the art and include, for example, addition-polymerization ethylenically unsaturated compounds having relatively low molecular weights (generally less than about 30,000). Preferably, the monomers have a relatively low molecular weight, less than about 5000.

Numerous unsaturated monomers, oligomers, and pre-polymers polymerizable by free-radical initiated addition polymerization and useful in photosensitive compositions are known in the art. Typical multifunctional monomers are unsaturated esters of alcohols, preferably acrylate and methacrylate esters of polyols, such as, trimethylol propane tri- and tetraacrylate and methacrylate; the tri- and tetraacrylate and methacrylate esters of ethoxylated trimethylolpropane; diethylene glycol diacrylate and dimethacrylate; triethylene glycol diacrylate and dimethacrylate; 1,4-butanediol diacrylate and dimethacrylate; 2,2,4-trimethyl-1,3-pentanediol diacrylate and dimethacrylate; 1,8-octanediol diacrylate and dimethacrylate; 1,10-decanediol diacrylate and dimethacrylate; polyethylene glycol diacrylate and dimethacrylate; glycerol triacrylate and trimethacrylate; ethylene glycol dimethacrylate; pentaerythritol tri- and tetra-acrylate and methacrylate; dipentaerythritol penta- and hexa-acrylate and methacrylate; tripropylene glycol diacrylate and dimethacrylate; the di-(2-acryloxyethyl)ether and the di-(2-methacryloxyethyl)ether of bisphenol A; ethoxylated bisphenol A diacrylate and dimethacrylate; 1,6-hexanediol diacrylate and dimethacrylate; and neo-pentyl glycol diacrylate and dimethacrylate. Monofunctional monomers, which are sometimes used in combination with multifunctional monomers include, for example, tert-butyl acrylate and methacrylate, N,N-diethylaminoethyl acrylate,2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, iso-bornyl acrylate and methacrylate, phenyl acrylate and methacrylate, 2-phenylethyl acrylate and methacrylate, and tetrahydrofurfuryl acrylate and methacrylate. Further examples of monomers useful in the photosensitive layer of flexographic printing plate precursors can be found in Chen, U.S. Pat. No. 4,323,636; Fryd, U.S. Pat. No. 4,753,865; Fryd, U.S. Pat. No. 4,726,877; and Feinberg, U.S. Pat. No. 4,894,315. Preferably, the monomer constitutes at least 5% by weight of the photosensitive composition.

The photoinitiator can be any single compound or combination of compounds that generate free radicals that initiate the polymerization of the monomer or monomers without excessive termination. The photoinitiator is sensitive to visible or ultraviolet radiation, preferably ultraviolet radiation, and should be insensitive to infrared radiation and preferably is thermally inactive at and below 185° C. Photoinitiators are disclosed in "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, ed, SITA Technology Ltd., London, 1991, Vol. 3, pp. 59–525. Suitable photoinitiators have been disclosed in Gruetzmacher, U.S. Pat. No. 4,460,675, and Feinberg, U.S. Pat. No. 4,894,315. Examples of photoinitiators include substituted and unsubstituted polynuclear quinones, benzophenone; benzophenone and 4,4'-bis(dimethylamino)benzophenone; benzophenone and 4,4'-bis(diethylamino)-benzophenone; 2-hydroxy-2-methyl-1-phenylpropan-1-one; 2,4,6-trimethylbenzolyl-diphenylphosphine oxide; 2,2-dimethoxy-2-phenyl-acetophenone (benzildimethyl ketal, BDK); 2-methyl-1-[4-(methylthio)phenyl]-2-morpholinopropanone-1; 1-hydroxycyclohexylphenyl ketone (HCPK); bis(2,6-dimethoxybenzolyl)-2,4,4-trimethyl-pentylphosphine oxide; and combinations thereof. The photoinitiators typically comprise about 0.001 wt % to 10.0 wt % of the weight of the photosensitive composition.

The photosensitive composition may comprise other additives depending on the final properties desired. Such additives include plasticizers, rheology modifiers, thermal polymerization inhibitors, tackifiers, colorants, surfactants, antioxidants, antiozonants, or fillers. Plasticizers are used to adjust the film-forming properties of the elastomer. Plasticizers are well known in the art and include, for example, aliphatic hydrocarbon oils, e.g., naphthenic and paraffinic oils; and liquid polydienes, e.g., liquid polybutadiene and liquid polyisoprene. Resistance of the elements and the flexographic printing plates prepared therefrom to oxygen and ozone attack can be improved by incorporating in the photosensitive composition a suitable amount of compatible antioxidants and/or antiozonants. Antioxidants include, for example, alkylated phenols, e.g., 2,6-di-tert-butyl-4-methyl phenol; alkylated bis-phenols, e.g., 2,2-methylene-bis-(4-methyl-6-tert-butyl phenyl); 1,3,5-trimethyl-2,4,6-tris(3,5-di-tert-butyl-4-hydroxybenzyl) benzene; 2-(4-hydroxy-3,5-tert-butyl anilino)-4,6-bis-(n-octylthio)1,3,5-triazone; polymerized trimethyl dihydroquinone; zinc dibutyl dithiocarbamate and dilaurylthiodipropionate. Antiozonants include, for example, microcrystalline wax and paraffin wax; dibutyl thiourea; 1,1,3,3-tetramethyl-2thiourea; norbornenes such as di-5-norbornene-2-methyl adipate; and unsaturated vegetable oils. The composition may also comprise one or more dyes for identification or aesthetic purposes, provided they are compatible with the other ingredients, do not strongly absorb the radiation used for photopolymerization, and do not otherwise interfere with photopolymerization.

The mixture of monomer, binder, photoinitiator, and, if any, other ingredients should produce a clear, non-cloudy photosensitive layer, without causing appreciable scattering of the radiation used for overall exposure. The thickness of the photosensitive layer can vary over a wide range depending upon the type of printing plate desired. Thick, soft reliefs are useful for flexographic printing. For so-called "thin plates", the photosensitive layer is about 0.05 to 0.17 cm thick. Thicker plates have a photosensitive layer about 0.25 to 0.64 cm thick, or greater.

Barrier Layer

An essentially oxygen-impermeable barrier layer, which is soluble in the developer and transmits the radiation used for the overall exposure, may be applied over the photosensitive layer. The barrier layer inhibits the migration of oxygen into the photosensitive layer and can also inhibit the migration of materials from the photosensitive layer into the masking layer. Preferred binders for the barrier layer are water-soluble polymers such as polyvinyl alcohol, polyvinyl alcohol/polyvinyl acetate co-polymers, polyvinyl pyrrolidone, vinyl pyrrolidone/vinyl acetate co-polymers, polyvinyl methyl ether, ring-opened co-polymers of maleic anhydride and co-monomers such as methyl vinyl ether, polyacrylic acid, gelatine, cellulose ethers, and mixtures thereof. Most preferred is polyvinyl alcohol.

The barrier layer may comprise other ingredients, such as surfactants. To improve the adhesion of the barrier layer to the photosensitive layer, an adhesion promoter can be added to the barrier layer formulation. One example for such an adhesion promoter is poly(vinyl imidazole) as disclosed in WO 99/06890. The coating weight of the barrier layer typically is about 0.1 to 6 g/m$^2$, and more typically about 0.5 to 4 g/m$^2$.

Masking Layer

The element comprises a masking layer that contains one or more sulfobetaine and/or a carboxybetaine containing co-polymers and a radiation absorber. The masking layer absorbs infrared radiation and the radiation used for overall exposure, typically ultraviolet radiation. The masking layer may also comprise a polymeric binder and other materials that are conventional ingredients of imageable layers, such as surfactants. The masking layer typically has a coating weight of about 1 g/m$^2$ to about 10 g/m$^2$, more typically about 3 g/m$^2$ to about 7 g/m$^2$. The masking layer may be coated onto a substrate, imaged and developed to form a photomask, and laid over the photosensitive layer or, if present, the barrier layer. However, the masking layer is typically formed over the photosensitive layer or, if present, the barrier layer, and, thus, is integral with the other layers of the imageable element. Imaging and development of the masking layer forms an integral photomask.

The masking layer typically comprises about 30 wt % to about 70 wt % of the betaine containing co-polymer; about 0.5 wt % to about 20 wt %, more typically about 1 wt % to about 15 wt %, of the photothermal conversion material; about 1 wt % to about 10 wt %, more typically about 1 wt % to about 5 wt %, of the material that absorbs ultraviolet radiation, and 0 wt % to about 30 wt % of the binder. When carbon black is present, it typically comprises about 15 wt % to about 40 wt % of the masking layer.

Sulfobetaine and/or a Carboxybetaine Containing Co-Polymers

The masking layer comprises a co-polymer that comprises a polymer backbone with sulfobetaine and/or a carboxybetaine-containing side chains. Typically, the polymeric binder is a co-polymer that comprises K units and L units. The K units are selected from —[CH$_2$C(R$^1$)R$^2$]—, —[CH$_2$CR$^3$(CO$_2$R$^4$)]—, —[CH$_2$CR$^3$(CON(R$^5$)(R$^6$))]—, —[C(R$^7$)(COECO)C(R$^7$)]—, and mixtures thereof. The L units, which comprise the betaine-containing side chains, are selected from —[CH$_2$C(R$^8$)(Q(CH$_2$)$_m$N(CH$_3$)$_2$(CH$_2$)$_n$SO$_3$)]—, —[CH$_2$C(R$^9$)(Q(CH$_2$)$_m$N(CH$_3$)$_2$(CH$_2$)$_n$CO$_2$)]—, and mixtures thereof. The K and L units are typically the only units present. Small amount of other units may be present, but are typically not necessary.

Each R$^1$, R$^3$, R$^7$, R$^8$, and R$^9$ is independently hydrogen or methyl. R$^2$ is independently hydrogen, methyl, phenyl, substituted phenyl, halogen, cyano, alkoxy of one to four carbon atoms, acyl of one to five carbon atoms, acyloxy of one to five carbon atoms, vinyl, or allyl. Substituted phenyl groups include, for example, 4-methylphenyl, 3-methylphenyl, 4-methoxyphenyl, 4-cyanophenyl, 4-chlorophenyl, 4-fluorophenyl, 4-acetoxyphenyl, and 3,5-dichlorophenyl. Halogen includes fluoro (F), chloro (Cl), and bromo (Br). Alkoxy groups of one to four carbon atoms include, for example, methoxy, ethoxy, n-propoxy, iso-propoxy, n-butoxy, and t-butoxy. Acyl of one to five carbon atoms include, for example, H$_3$CO— (acetyl), CH$_3$CH$_2$CO—, CH$_3$(CH$_2$)$_2$CO—, CH$_3$(CH$_2$)$_3$CO—, and (CH$_3$)$_3$CCO—. Acyloxy of one to five carbon atoms include, for example, H$_3$CC(O)O— (acetyloxy), CH$_3$CH$_2$C(O)O—, CH$_3$(CH$_2$)$_2$C(O)O—, CH$_3$(CH$_2$)$_3$C(O)O—, and (CH$_3$)$_3$CC(O)O—. Each R$^4$, R$^5$, and R$^6$ is independently hydrogen, alkyl of one to six carbon atoms, cycloalkyl of one to six carbon atoms, or phenyl. Alkyl groups of one to six carbon atoms, include, for example, methyl, ethyl, n-propyl, iso-propyl, n-butyl, sec-butyl, iso-butyl, t-butyl, n-pentyl, iso-pentyl, neo-pentyl, n-hexyl, iso-hexyl, 1,1-dimethyl-butyl, and 2,2-dimethyl-butyl. Cycloalkyl groups of one to six carbon atoms include, for example, cyclopropyl, cyclobutyl, cyclopentyl, methylcyclopentyl, and cyclohexyl. Each Q is independently CO$_2$, O, S, CONH, or CH$_2$. m is one to eight. n is two to four.

—[C(R$^7$)(COECO)C(R$^7$)]— represents a cyclic anhydride or cyclic imide structure, such as is produced on free radical polymerization of maleic anhydride or N-phenyl maleimide. That is, the first and last carbon atoms are bonded by a carbon-carbon single bond. E is oxygen or NR$^{10}$ in which each R$^{10}$ is hydrogen, hydroxyl, phenyl, substituted phenyl, alkyl of one to six carbon atoms, or benzyl.

Mixtures of substituents may be used. For example, a betaine-containing co-polymer may comprise K units in which R$^1$ is hydrogen and K units in which R$^1$ is methyl, and/or K units in which R$^2$ is methyl and K units in which R$^2$ is phenyl.

The K units are typically —[CH$_2$C(R$^1$)R$^2$]— and/or —[CH$_2$CR$^3$(CO$_2$R$^4$)]—. R$^2$ is typically phenyl and/or cyano. R$^4$ is typically methyl. Q is typically CO$_2$ and/or CONH. m is typically two to four.

The weight ratio of K units to L units is typically about 99:1 to about 1:99, more typically about 95:5 to about 20:80, even more typically about 80:20 to about 30:70. The weight average molecular weight of the polymeric binder is typically about 2,000 to about 1,000,000; more typically about 5,000 to about 500,000; even more typically about 10,000 to about 100,000.

The betaine-containing co-polymers may be prepared by free radical polymerization. In a typical preparation, one or more monomers which are the precursor of the K units and one or more monomers which are the precursors of the L units are co-polymerized. Free radical polymerization is well known to those skilled in the art and is described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Chain transfer agents, such as dodecyl mercaptan, may be used to control the molecular weight of the compound. Suitable solvents for free radical polymerization include liquids that are inert to the reactants and which will not otherwise adversely affect the reaction, for example, water; esters such as ethyl acetate and butyl acetate; ketones such as 2-butanone, methyl isobutyl ketone, methyl propyl ketone, and acetone; alcohols such as methanol, ethanol, isopropyl alcohol, and butanol; ethers such as dioxane and tetrahydrofuran, and mixtures thereof.

Precursors of the K unit include, for example, styrene, 3-methyl styrene, 4-methyl styrene, 4-methoxy styrene, 4-acetoxy styrene, alpha-methyl styrene, acrylic acid, methyl acrylate, ethyl acrylate, butyl acrylate, n-hexyl acrylate, methacrylic acid, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, allyl methacrylate, methyl cyanoacrylate, ethyl cyanoacrylate, vinyl acetate, vinyl butyrate, methyl vinyl ketone, butyl vinyl ketone, acrylonitrile, methacrylonitrile, vinyl chloride, vinyl bromide, 1,3-butadiene, 1,4-pentadiene, acrylamide, methacrylamide, N,N-dimethyl-acrylamide, N,N-dimethyl-methacrylamide, maleic anhydride, maleimide, N-phenyl maleimide, N-cyclohexyl maleimide, N-benzyl maleimide, N-hydroxy maleimide, and mixtures thereof. Preferred precursors for the K unit include styrene, methyl methacrylate, and acrylonitrile. When units derived from both styrene and methyl methacrylate are included in the co-polymer, the K units are a mixture of —[CH$_2$C(R$^1$)R$^2$]— and —[CH$_2$CR$^3$(CO$_2$R$^4$)]—, in which R$^1$ is hydrogen, R$^2$ is phenyl, and R$^3$ and R$^4$ are each methyl. When units derived from both styrene and acrylonitrile are included in the co-polymer, the K units are —[CH$_2$C(R$^1$)R$^2$]—, in which R$^1$ is hydrogen, and R$^2$ is a mixture of cyano and phenyl.

Precursors of the L unit include, for example, compounds of the general structure:

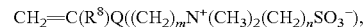

$$CH_2=C(R^8)Q((CH_2)_mN^+(CH_3)_2(CH_2)_nSO_3^-),$$

such as [2-(methacryloyloxy)ethyl]dimethyl-(2-sulfoethyl)ammonium betaine, inner salt; [2-(methacryloyloxy)ethyl]dimethyl-(3-sulfopropyl)ammonium betaine, inner salt; [2-(methacryloyloxy)ethyl]dimethyl-(4-sulfobutyl)ammonium betaine, inner salt; [3-(methacryloyloxy)propyl]dimethyl-(2-sulfoethyl)ammonium betaine, inner salt; [3-(methacryloyloxy)propyl]dimethyl-(3-sulfopropyl)ammonium betaine, inner salt; [3-(methacryloyloxy)propyl]dimethyl-(4-sulfobutyl)ammonium betaine, inner salt; [4-(methacryloyloxy)butyl]dimethyl-(3-sulfopropyl)ammonium betaine, inner salt; [5-(methacryloyloxy)pentyl]dimethyl-(3-sulfopropyl)ammonium betaine, inner salt; [6-(methacryloyloxy)hexyl]dimethyl-(3-sulfopropyl)ammonium betaine, inner salt; [7-(methacryloyloxy)heptyl]dimethyl-(3-sulfopropyl)ammonium betaine, inner salt; [8-(methacryloyloxy)octyl]dimethyl-(3-sulfopropyl)ammonium betaine, inner salt; [2-methacryloylamino)ethyl]dimethyl-(2-sulfoethyl) ammonium betaine, inner salt; [2-methacryloylamino)ethyl]dimethyl-(3-sulfopropyl)ammonium betaine inner salt; [2-methacryloylamino)ethyl]dimethyl-(4-sulfobutyl)ammonium betaine, inner salt; [3-methacryloylamino)propyl]dimethyl-(2-sulfoethyl)ammonium betaine, inner salt; [3-methacryloylamino)propyl]dimethyl-(3-sulfopropyl)ammonium betaine, inner salt; [3-methacryloylamino)propyl]dimethyl-(4-sulfobutyl) ammonium betaine, inner salt; [4-methacryloylamino) butyl]dimethyl-(3-sulfopropyl)ammonium betaine, inner salt; [5-methacryloylamino)pentyl]dimethyl-(3-sulfopropyl)ammonium betaine, inner salt; [6-methacryloylamino)hexyl]dimethyl-(3-sulfopropyl)ammonium betaine, inner salt; [7-methacryloylamino)heptyl] dimethyl-(3-sulfopropyl)ammonium betaine, inner salt; [8-methacryloylamino)octyl]dimethyl-(3-sulfopropyl)ammonium betaine, inner salt; [2-(acryloyloxy) ethyl]dimethyl-(3-sulfopropyl)ammonium betaine, inner salt; [3-(acryloyloxy)propyl]dimethyl-(3-sulfopropyl)ammonium betaine, inner salt; [4-(acryloyloxy) butyl]dimethyl-(3-sulfopropyl)ammonium betaine, inner salt; [5-(acryloyloxy)pentyl]dimethyl-(3-sulfopropyl)ammonium betaine, inner salt; [6-(acryloyloxy) hexyl]dimethyl-(3-sulfopropyl)ammonium betaine, inner salt; [7-(acryloyloxy)heptyl]dimethyl-(3-sulfopropyl)ammonium betaine, inner salt; [8-(acryloyloxy) octyl]dimethyl-(3-sulfopropyl)ammonium betaine, inner salt; [2-acryloylamino)ethyl]dimethyl-(3-sulfopropyl)ammonium betaine, inner salt; [3-acryloylamino)propyl]dimethyl-(3-sulfopropyl)ammonium betaine, inner salt; [4-acryloylamino)butyl]dimethyl-(3-sulfopropyl)ammonium betaine, inner salt; [5-acryloylamino)pentyl]dimethyl-(3-sulfopropyl)ammonium betaine, inner salt; [6-acryloylamino)hexyl]dimethyl-(3-sulfopropyl)ammonium betaine, inner salt; [7-acryloylamino)heptyl]dimethyl-(3-sulfopropyl)ammonium betaine, inner salt; [8-acryloylamino)octyl]dimethyl-(3-sulfopropyl)ammonium betaine, inner salt; compounds of the general structure:

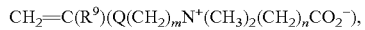

$CH_2=C(R^9)(Q(CH_2)_mN^+(CH_3)_2(CH_2)_nCO_2^-)$, such as [2-(methacryloyloxy)ethyl]dimethyl-(2-carboxyethyl)ammonium betaine, inner salt; [2-(methacryloyloxy)ethyl]dimethyl-(3-carboxypropyl)ammonium betaine, inner salt; [3-(methacryloyloxy)propyl]dimethyl-(2-carboxyethyl)ammonium betaine, inner salt; [3-(methacryloyloxy)propyl]dimethyl-(3-carboxypropyl)-ammonium betaine, inner salt; [2-(methacryloylamino)ethyl]dimethyl-(2-carboxyethyl)ammonium betaine, inner salt; [2-(methacryloylamino)ethyl]dimethyl-(3-carboxypropyl)ammonium betaine, inner salt; [3-(methacryloylamino)propyl]dimethyl-(2-carboxyethyl)ammonium betaine, inner salt; [3-(methacryloylamino)propyl]dimethyl-(3-carboxypropyl)ammonium betaine, inner salt;
and mixtures thereof.

Radiation Absorber

The masking layer absorbs ultraviolet radiation and infrared radiation and comprises a radiation absorber. The radiation absorber is a material that absorbs both infrared and ultraviolet radiation and/or a mixture of materials that together absorb both infrared and ultraviolet radiation. Provided the material or materials are compatible with the other ingredients of the masking layer and do not adversely affect the operation of the imageable element, any combination of infrared absorbing, ultraviolet absorbing, and/or infrared and ultraviolet absorbing materials may be used, as long as the masking layer absorbs the amount of both infrared radiation and ultraviolet radiation needed for operation of the masking layer. Although when the masking layer is to be imaged with a hot body, it is not necessary for the masking layer to absorb infrared radiation, masking layers that absorb infrared radiation may also be imaged with a hot body, such as a thermal head or an array of thermal heads.

Photothermal conversion materials are infrared-absorbing materials that have a strong absorption in the region of the infrared imaging radiation, between 750 nm to 2,000 nm, typically from about 800 nm to 1200 nm. The material that absorbs ultraviolet radiation and the photothermal conversion material may be different materials, or they may be the same material. Carbon black, for example, is a particularly useful absorber because of its low cost and because of its wide absorption bands that absorb ultraviolet, visible, and infrared radiation. It can function as both an ultraviolet absorber and a photothermal conversion material. It can be used by itself or with one or more materials that absorb ultraviolet radiation and/or one or more photothermal conversion materials. The carbon black may form an ionically stabilized carbon dispersion comprising carbon that is functionalized with ionic groups, preferably quaternary ammonium, sulfonate, or carboxylate groups. Examples of such ionically stabilized carbon black dispersions include CAB-O-JET® 200, CAB-O-JET® 300, and CAB-O-JET® IJX-144 (Cabot). Or the carbon black forms a polymer-grafted dispersion comprising carbon that is covalently bound to polymeric chains. Examples of such polymer-grafted dispersions include FX-GEW-42 and FX-GE-003 (Nippon Shokubai). Or the carbon black may form a dispersion comprising carbon and a dispersant in water. Examples of such dispersions include GA BLACK 12031 and GA BLACK 12032 (Mikuni Color). A mixture of two or more carbon blacks may be used. The size of the carbon black particles should not be more than the thickness of the layer that contains the carbon black. Preferably, the size of the particles will be half the thickness of the layer or less. When present, carbon black typically about 15 wt % to about 40 wt % of the masking layer.

Other materials that absorb ultraviolet radiation may be used in place of or in addition to carbon black. Materials that absorb ultraviolet radiation include, for example, p-aminobenzoic acid (PABA); 2,2',4,4'-tetrahydroxybenzophenone (benzophenone-1); 2-hydroxy-4-methoxybenzophenone (benzophenone-3); 2,4-dihydroxybenzophenone (benzophenone-2); 2-hydroxy-4-methoxybenzophenone-5-sulfonic acid (benzophenone-4); 2,2'-dihydroxy-4,4'-dimethoxybenzophenone (benzophenone-6); 2,2'-dihydroxy-4-methoxy-benzophenone (benzophenone-8), 2-hydroxy-4-n-octoxy benzophenone (benzophenone-12); methoxycinnamate; ethyl dihydroxypropyl-PABA; glyceryl PABA; homosalate (homomenthyl salicylate); meradimate (menthyl anthranilate); octocrylene (2-ethylhexyl-2-cyano-3,3-diphenylacrylate); octyl dimethyl PABA; octinoxate (octyl methoxycinnamate); octisalate (octyl salicylate); avobenzone (4-t-butyl-4'-methoxy-dibenzoylmethane); ensulizone (2-phenylbenzimidazole-5-sulphonic acid); trolamine salicylate (triethanolamine salicylate); 3-(4-methylbenzylidene)-camphor; red petrolatum; and mixtures thereof. When present, the ultraviolet absorber comprises about 1 wt % to about 10 wt % of the masking layer. Preferably, the $D_{max}$ of the masking layer in the wavelength region used for overall exposure, typically the ultraviolet, is greater than 3, and more preferably greater than 4.

Other materials that absorb infrared radiation (photothermal conversion materials) may be used in place of or in addition to carbon black. The photothermal conversion material may be a dye with the appropriate absorption spectrum. Dyes, especially dyes with a high extinction coefficient in the range of 750 nm to 1200 nm, may be used. Examples of suitable dyes include dyes of the following classes: methine, polymethine, cyanine, arylmethine, hemicyanine, streptocyanine, squarylium, pyrylium, oxonol, naphthoquinone, anthraquinone, porphyrin, azo, croconium, triarylamine, indolium, oxazolium, indocyanine, indotricarbocyanine, oxatricarbocyanine, phthalocyanine, thiocyanine, thiatricarbocyanine, merocyanine, cryptocyanine, naphthalocyanine, thiazolium, polyaniline, polythiophene, chalcogenopyryloarylidene and bis(chalcogenopyrylo)polymethine, polypyrrole, oxyindolizine, pyrazoline azo, and oxazine classes. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectralR 830A and SpectralR 840A (Spectra Colors), as well as the compound whose structure is shown immediately below.

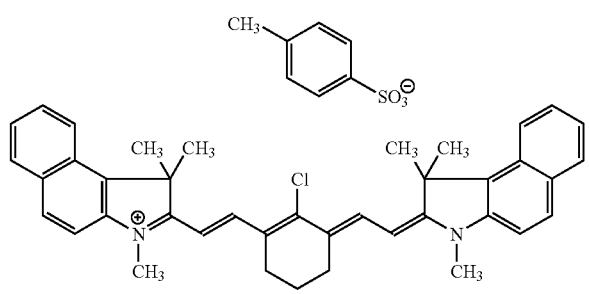

When the imaged masking layer is to be developed with an aqueous developer, infrared absorbing compounds that are soluble in water are preferred. For example, water-soluble N-alkyl sulfate infrared absorbing cyanine compounds of Structure I may be used in the masking layer.

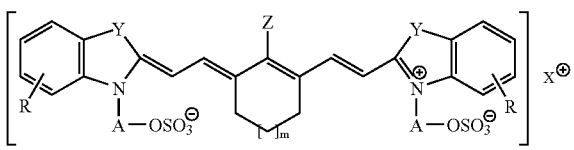

in which:

R is hydrogen, or R is one or more alkyl, substituted or unsubstituted aralkyl, alkoxy, carboxyl, nitro, cyano, trifluoromethyl, acyl, alkyl sulfonyl, aryl sulfonyl, or halogen groups, or R is the atoms necessary to form a substituted or unsubstituted benzo group;

A is $(CH_2)_n$; where n is 1–5; preferably 2–4;

Y is O, S, NR', or $C(R')_2$, where R' is hydrogen or alkyl; preferably methyl;

Z is hydrogen, halogen, alkyl, substituted or unsubstituted aralkyl; substituted or unsubstituted aroxyl, substituted or unsubstituted thioaroxyl, or substituted or unsubstituted diphenylamino;

m is zero or one; and

X is a cation, preferably sodium, potassium, lithium, ammonium, or substituted ammonium.

Y is preferably S or $C(CH_3)_2$.

The preparation of these infrared absorbing compounds is described in U.S. patent application Ser. No. 10/736,364, filed Dec. 15, 2003. The triethyl ammonium salts, for example, may be prepared by the following procedure:

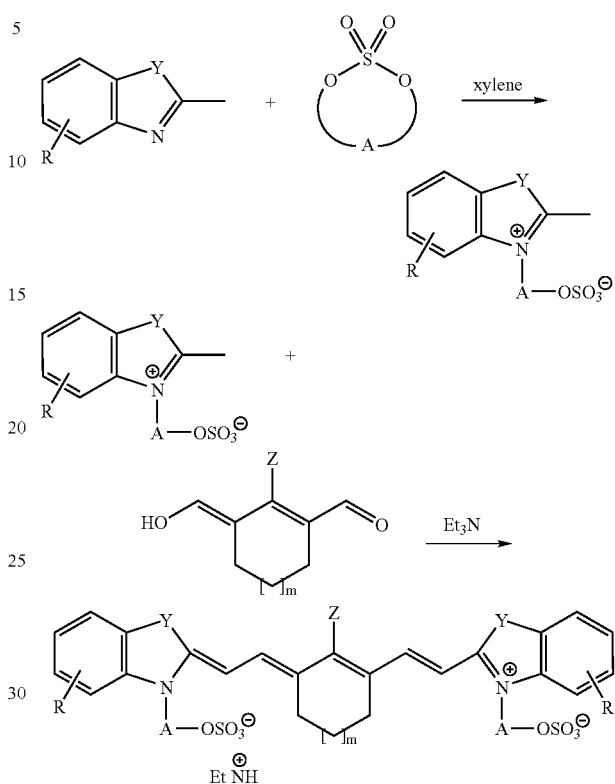

The amount of photothermal conversion material is generally chosen to provide an optical density of at least 0.05, and preferably, an optical density of about 0.5 to at least about 2 to 4 in the masking layer at the imaging wavelength. As is well known to those skilled in the art, the amount of compound required to produce a particular optical density can be determined from the thickness of the layer in which it is present and the extinction coefficient of the photothermal conversion material at the wavelength used for imaging using Beer's law.

Other Ingredients

The masking layer may comprise a water-soluble polymeric binder, such as, polyvinyl pyrrolidone, polyvinyl alcohol, polyacrylamide, polyacrylic acid, polyvinylimidazole, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose, and carboxymethylcellulose. Binders that are not water-soluble, such as polyvinyl pyrrolidone/vinyl acetate co-polymers and polyvinyl pyrrolidone/vinyl caprolactam co-polymers, may also be suitable.

When the masking layer comprises a binder, the binder comprises not more than about 30% by weight of the thermally sensitive composition, preferably not more than about 20%, more preferably not more than about 10%, and most preferably not more than about 5%, by weight of the masking layer.

Other ingredients that are conventional components of thermally sensitive compositions, such as surfactants, may also be present.

Cover sheet

The imageable element may also comprise a temporary cover sheet over the masking layer. The cover sheet protects the masking layer during storage and handling. Examples of suitable materials for the cover sheet include thin films of polystyrene, polyethylene, polypropylene, polycarbonate, fluoropolymers, polyamide or polyester, which can be subbed with release layers, to aid in removal prior to imaging.

Preparation of the Imageable Elements

When the imageable element comprises a photosensitive layer, the imageable elements may be prepared by first applying a layer of photosensitive composition over a surface of the substrate using conventional extrusion, coating, or lamination methods. Typically the ingredients are dispersed or dissolved in a suitable coating solvent, and the resulting mixture coated by conventional methods, such as spin coating, bar coating, gravure coating, roller coating, dip coating, air knife coating, hopper coating, blade coating, slot coating, and spray coating. The term "coating solvent" includes mixtures of solvents.

A variety of conventional organic solvents, for example, alcohols such as methyl alcohol, ethyl alcohol, n- and i-propyl alcohols, n- and i-butyl alcohols and diacetone alcohol; ketones such as acetone, methyl ethyl ketone, methyl propyl ketone, diethyl ketone, and cyclohexanone; polyhydric alcohols and derivatives thereof such as ethylene glycol, ethylene glycol monomethyl ether or its acetate, ethylene glycol monoethyl ether or its acetate; ethylene glycol diethyl ether, ethylene glycol monobutyl ether or its acetate, propylene glycol monomethyl ether or its acetate, propylene glycol monoethyl ether or its acetate, propylene glycol monobutyl ether, 3-methyl-3-methoxybutanol; and special solvents such as N,N-dimethylformamide, methyl lactate, and ethyl lactate, can be used as the coating solvent for the photosensitive layer. However, for convenience during the drying process, solvents having a boiling point of between about 40° C. and about 160° C., preferably between about 60° C. and about 130° C., are typically used. The solids content of the coating solution is typically about 2 to about 25 wt %, based on the weight of the solvent. Selection of the coating solvent will also depend on the nature of the ingredients present in the photosensitive composition.

Drying of the precursor is usually carried out using heated air. The air temperature is preferably between about 30° C. and about 200° C., more preferably between about 40° C. and about 120° C. The air temperature may be held constant during the drying process, or may be gradually stepped up.

Alternatively, the ingredients may be fed into an extruder and the photosensitive layer extruded onto the substrate. The extruder performs the function of melting, mixing, deaerating, and filtering the photosensitive composition.

The barrier layer, if present, may be applied over the photosensitive layer using conventional coating or lamination techniques, such as are described above. To prevent mixing of the layers during coating, the masking layer is preferably coated from a solvent in which the photosensitive layer is essentially insoluble. Typical coating solvents for the masking layer are water and aqueous solvents that contain small amounts of organic solvents such as methanol, ethanol, or i-propyl alcohol.

The masking layer may be applied over the barrier layer, if present, or the photosensitive layer if the barrier layer is not present, using conventional coating or lamination techniques, such as are described above. Typically the ingredients of the masking layer are dispersed or dissolved in a suitable coating solvent, such as water or a mixture of water and an organic solvent such as methanol, ethanol, iso-propyl alcohol, and/or acetone, and the resulting mixture coated by conventional methods, such as are described above. After coating, the layer is dried to remove the coating solvent. The resulting element may be air dried at ambient temperature or at an elevated temperature, such as at about 65° C. for about 20 seconds in an oven. Alternatively, the resulting imageable element may be dried by blowing warm air over the element.

When the imageable layer does not comprise the photosensitive layer, the masking layer is coated directly onto the substrate using the procedures described above. The cover sheet, if present, is typically laminated over the masking layer.

Imaging and Processing

The cover sheet, if present, is removed before imaging, typically by being peeled off. The masking layer is thermally imaged, using a hot body such as a thermal head, or an infrared laser.

Imaging of the masking layer may be carried out by well-known methods. The masking layer may be imaged with a laser or an array of lasers emitting modulated near infrared or infrared radiation in a wavelength region that is absorbed by the absorber layer. Infrared radiation, especially infrared radiation in the range of about 800 nm to about 1200 nm, is typically used for imaging thermally imageable elements. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the thermally imageable element may be imaged using a hot body, typically with a conventional apparatus containing a thermal printing head. An imaging apparatus suitable for use in conjunction with thermally imageable composition comprises at least one thermal head but would usually include a thermal head array, such as a TDK Model No. LV5416 used in thermal fax machines and sublimation printers or the GS618-400 thermal plotter (Oyo Instruments, Houston, Tex., USA). The operating temperature of the thermal head is typically about 300° C. to 400° C. The typical heating time per pixel may be less than 1.0 ms. A contact pressure about 200 to 500 g/cm$^2$ between the thermal head and the imageable element typically is required for good heat transfer.

Imaging of the masking layer produces a latent image of imaged and unimaged regions in the masking layer. The imaged regions are less soluble in water or aqueous solutions that the unimaged regions, that is, when thermally imaged, the masking layer is negative working.

Developing of the masking layer may be carried out with an aqueous developer, but in many cases water alone may be used. Typical developing equipment known in the art, such as the Aurora Aquascrubber 34 (Northeast Equipment Services, Westfield, Mass., USA), may be used. Development removes the unimaged regions of the masking layer, preferably reducing their optical density in the wavelength region used for the overall exposure to less than 0.1.

Following imaging and developing of the masking layer, the element is subjected to floodwise (overall or blanket) exposure with ultraviolet and/or visible radiation to which the photosensitive layer is sensitive. The radiation is effectively blocked by the imaged regions of the masking layer, but is at least partly transmitted by regions of the masking layer that were not imaged and, thus, were substantially removed during development. The radiation used for blanket exposure is typically in the range of 250 nm to 500 nm. Radiation sources are well known to those skilled in the art, and include, for example, carbon arcs, mercury-vapor lamps, fluorescent lamps, electron flash units, electron beam units, and photographic flood lamps. The most suitable sources of ultraviolet radiation are mercury-vapor lamps, particularly sun lamps. One typical radiation source is the SYLVANIA® 350 Blacklight fluorescent lamp (FR 48T12/350 VL/VHO/180, 115 w), which has a central wavelength of emission around 354 nm.

Overall exposure forms a latent image in the photosensitive layer. In the case of a negative-working photosensitive layer, the latent image is made up of polymerized regions, which correspond to the unimaged regions of the masking layer, and unpolymerized regions, which correspond to the imaged regions of the masking layer. The exposure level depends on the thickness of the photosensitive layer, its sensitivity to the radiation used for overall exposure, and the amount of radiation transmitted by the unimaged regions of the masking layer. However, the level of exposure is usually at least 0.1 mJ/cm$^2$.

When the photosensitive layer is negative working, such when the photosensitive layer comprises a photopolymerizable composition, the process typically also comprises a backflash exposure. Backflash exposure is a blanket exposure through the substrate, using radiation to which the photosensitive layer is sensitive. Backflash exposure creates a shallow layer of photopolymerized material, or a floor, on the substrate side of the photosensitive layer. The floor improves adhesion between the photosensitive layer and the support and also establishes the depth of the relief image in the resulting flexographic printing plate. Backflash exposure may be carried out before, during, or after the other imaging steps. Preferably, it is carried out after imaging of the masking layer and just prior to overall exposure. Any of the conventional radiation sources discussed above can be used for the backflash exposure step. Exposure time generally ranges from a few seconds up to about a minute.

Following overall exposure through the mask, and optionally backflashing, the masking layer is removed. Typically, it is merely peeled away, but alternatively it may be removed as part of the developing step. In either case, the element is then developed by washing with a suitable developer. Development is usually carried out at about room temperature, and converts the latent image to an image by removing the unpolymerized regions of the photosensitive layer.

The developers can be organic solvents, aqueous or semi-aqueous solutions, and water. The choice of the developer will depend primarily on the chemical nature of the photopolymerizable layer. Suitable organic solvent developers include aromatic or aliphatic hydrocarbon and aliphatic or aromatic halohydrocarbon solvents, or mixtures of such solvents with suitable alcohols. Other organic solvent developers have been disclosed in Schober, U.S. Pat. No. 5,354,645. Suitable semi-aqueous developers usually contain water and a water miscible organic solvent and an alkaline material. Suitable aqueous developers usually contain water and an alkaline material. Other suitable aqueous developer combinations are described in Briney, U.S. Pat. No. 3,796,602.

Development time can vary, but it is typically in the range of about 2 to 25 minutes. Developer can be applied in any convenient manner, including immersion, spraying and brush or roller application. Brushing aids can be used to remove the unpolymerized portions of the photosensitive layer. However, washout is frequently carried out in an automatic processing unit, which uses developer and mechanical brushing action to remove the unexposed portions of the photosensitive layer, leaving a relief constituting the exposed image and the floor formed by the backside flask exposure.

Alternatively, when the photosensitive layer is not part of the imageable element, the element consisting of the masking layer on the substrate is imaged and developed as described above to form a photomask. The photomask is then placed on an imageable element comprising the photosensitive layer, a substrate, and, optionally, a barrier layer. The photosensitive layer is imaged through the photomask as described above, the photomask removed, and the imaged photosensitive layer developed as described above. Imaging is conveniently carried out in a vacuum frame to ensure good contact between the mask and the imageable element.

Following development, the resulting flexographic printing plates are typically blotted or wiped dry, and then dried in a forced air or infrared oven. Drying times and temperatures may vary, however, typically the plate is dried for 60 to 120 minutes at 60° C. High temperatures are not recommended because the support can shrink, which may cause registration problems.

Flexographic printing plates are typically overall post-exposed to ensure that the photopolymerization process is complete and that the plate will remain stable during printing and storage. This post-exposure may be carried out with the same radiation source as was used for overall exposure.

Detackification is an optional post-development treatment that can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher, U.S. Pat. No. 4,400,459; Fickes, U.S. Pat. No. 4,400,460; and Herrmann, U.S. Pat. No. 4,906,551. Detackification can also be accomplished by exposure to radiation sources having a wavelength not longer than 300 nm, as disclosed in Gibson U.S. Pat. No. 4,806,506.

INDUSTRIAL APPLICABILITY

The imageable element can be used in the preparation of flexographic printing plates that can be used under white light conditions; they do not require the use of a safelight. Use of imageable elements comprising masking layers allows digital imaging of the plates using readily available thermal lasers, followed by exposure of the photosensitive layer with readily available high-power ultraviolet exposure equipment. This approach circumvents use of an ultraviolet laser to image the photosensitive layer, a method that is difficult by the lack of commercially available, economical, and reliable ultraviolet lasers. Optionally, if a heated body is used for imaging, infrared absorber is not required at all, further reducing material costs.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

GLOSSARY

AIBN 2,2'-Azobisisobutyronitrile (DuPont, Wilmington, Del., USA)
BONJET® Black CW-1 Carbon black suspension, 20% in water (Orient Corporation, Seaford, Del., USA)
CREO® Trendsetter 3230 Commercially available platesetter, using Procom Plus software, operating at a wavelength of 830 nm (Creo Products Inc., of Burnaby, BC, Canada)
FXGE 003 Carbon suspended in ethanol, 15% by weight (Nippon Shokubai, Otabi-cho, Suita, Osaka, Japan)
IR Dye A Infrared absorber (see structure below) (Eastman Kodak, Rochester, N.Y., USA)
LODYNE® 103A Fluorosurfactant (Ciba Specialty Chemicals, Tarrytown, N.Y., USA)

IR DYE A

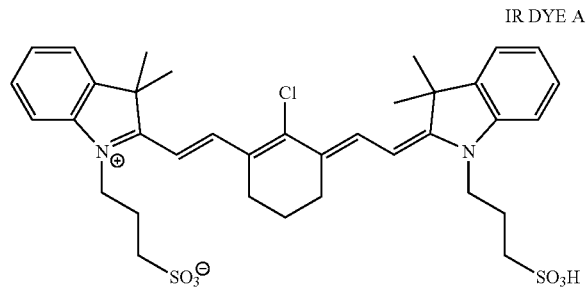

Example 1

This example illustrates the synthesis of [2-(methacryloyloxy)ethyl]dimethyl-( 2-carboxyethyl)ammonium betaine, inner salt, a carboxybetaine-containing monomer, and polymerization of the monomer to form a carboxybetaine-containing polymer. In a 50-ml flask, 6.3 g (0.04 mol) of N,N-dimethylaminoethyl methacrylate (Aldrich, Milwaukee, Wis., USA) in 8 g of 2-butanone was stored at 0° C. for 1 hr. 2.9 g (0.04 mol) of β-propiolactone (Aldrich, Milwaukee, Wis., USA) in 6 g of 2-butanone cooled at 0° C. was added dropwise to the flask. The resulting mixture was stirred at room temperature for 3 hr and stored in refrigerator for 3 hr. A white precipitate formed. 4.7 g of the solid carboxybetaine-containing monomer was collected by filtration. Proton NMR (in $D_2O$): δ 1.80 (3H, s), 2.59 (2H, t), 3.02 (6H, s), 3.52 (2H, t), 3.63 (2H, t), 4.50 (2H, m), 5.62 (1H, m) and 6.05 (1H, m).

0.1g of AIBN, 3.5 g of methyl methacrylate, 1.5 g of the carboxybetaine-containing monomer, 20 g of n-propanol, and 20 g of water were placed in a 100 ml, 3-necked flask, equipped with magnetic stirring, temperature controller, and nitrogen inlet. The reaction mixture was heated to 60° C. and stirred under nitrogen for 6 hr. 0.05 g of AIBN was added, and heating and stirring continued for an additional 16 hr. After the reaction mixture was cooled to room temperature, about 43 g of polymer solution was obtained. The % of non-volatiles was about 9.2%.

Example 2

This example illustrates a procedure for synthesis of the sulfobetaine containing co-polymer. 0.2 g of AIBN, 6.0 g of methyl methacrylate, 4.0 g of 2-(methacryloyloxy)ethyldimethyl-(3-sulfopropyl)ammonium hydroxide (Aldrich, Milwaukee, Wis., USA), 40 g of n-propanol, and 40 g of water were placed in a 150-ml 3-necked flask equipped with magnetic stirring, temperature controller and nitrogen inlet. The reaction mixture was stirred and heated at 60° C. under nitrogen for 6 hr. AIBN (0.1 g) was added and heating and stirring continued for an additional 16 hr. After the reaction mixture was cooled to room temperature, about 90 g of polymer solution was obtained. The % of non-volatiles (N.V.) was 11%.

Example 3

This example illustrates a procedure for making a mask using the carboxybetaine-containing co-polymer formed in Example 1. A coating solution was prepared containing: the co-polymer solution of Example 1, 6.3 g; FXGE-003, 2.3 g; IR Dye A, 0.018 g; LONDYNE® 103A, 0.02 g; water, 5.68 g; and 1-propanol, 5.68 g. The coating solution was coated onto an unsubbed polyester film using a wire wound bar. The resulting imageable element was dried in a Ranar conveyor oven at about 65° C. for about 1 min. A second layer of the same coating solution was applied on the top of the first layer and dried. Dry weight of the masking layer: about 2.5 $g/m^2$.

The resulting imageable element was placed on a CREO® Trendsetter 3244x image setter and imaged with 830 nm infrared laser radiation at a power of 12 W and a range of drum speeds from 195 to 35 rpm (corresponding to exposure energies ranging from 146 to 813 $mJ/cm^2$). The imaged imageable element was developed in tap water, and the minimum exposure energy to achieve maximum processed density (1.63, black) was about 380 $mJ/cm^2$ (see Table below).

Density readings were made with a GretagMacbeth D196 densitometer (Gretag-Macbeth AG, Switzerland). The larger the number, the darker the mask. Black, cyan, magenta, and yellow refer to the filter on the densitometer used to make the reading. Although the mask is black, the densitometer generates readings for all four colors.

| Color | Density Reading at Exposure Values ($mJ/cm^2$) | | | | | | | | | |
|---|---|---|---|---|---|---|---|---|---|---|
| | Background[a] | 146 | 163 | 184 | 211 | 247 | 300 | 379 | 517 | 813 |
| Black | 0.05 | 0.32 | 0.61 | 1.00 | 1.22 | 1.41 | 1.58 | 1.63 | 1.56 | 1.60 |
| Cyan | 0.05 | 0.29 | 0.56 | 0.93 | 1.15 | 1.33 | 1.50 | 1.54 | 1.47 | 1.52 |
| Magenta | 0.05 | 0.33 | 0.62 | 1.00 | 1.23 | 1.41 | 1.57 | 1.61 | 1.55 | 1.59 |
| Yellow | 0.07 | 0.43 | 0.82 | 1.32 | 1.60 | 1.81 | 1.99 | 2.04 | 1.97 | 2.03 |

[a]0 $mJ/cm^2$ exposure

Example 4

This example illustrates a procedure for making a mask using the sulfobetaine-containing co-polymer prepared in Example 2. A coating solution was prepared containing: the co-polymer solution of Example 2, 5.9 g; BONJET® Black CW-1; 1.8 g; IR Dye A, 0.018 g; LONDYNE® 103A 0.01 g; water, 6.0 g; and 1-propanol, 6.1 g. The coating solution was coated as in Example 3. Dry weight of the masking layer: about 2.5 g/m².

The resulting imageable element was imaged, developed, and evaluated as in Example 3. The minimum exposure energy to achieve maximum processed density (2.36, black) was about 180 mJ/cm² (see Table below).

| Color | Background[a] | Density Reading at Exposure Values (mJ/cm²) | | | | | | | | |
|---|---|---|---|---|---|---|---|---|---|---|
| | | 146 | 163 | 184 | 211 | 247 | 300 | 379 | 517 | 813 |
| Black | 0.00 | 0.43 | 2.35 | 2.36 | 2.35 | 2.34 | 2.27 | 2.05 | 1.47 | 0.64 |
| Cyan | 0.13 | 0.58 | 2.33 | 2.30 | 2.30 | 2.25 | 2.22 | 2.01 | 1.48 | 0.54 |
| Magenta | −0.04 | 0.37 | 2.08 | 2.06 | 2.07 | 2.04 | 2.03 | 1.86 | 1.43 | 0.67 |
| Yellow | −0.01 | 0.48 | 2.36 | 2.38 | 2.38 | 2.36 | 2.31 | 2.17 | 1.86 | 0.97 |

[a]0 mJ/cm² exposure.

Example 5

This example illustrates a procedure for making a mask using the sulfobetaine-containing co-polymer prepared in Example 2 and a higher content of the radiation absorber. A coating solution was prepared containing: the co-polymer solution of Example 2, 5.9 g; BONJET® Black CW-12.3 g; IR Dye A, 0.018 g; LONDYNE® 103A 0.01 g; water, 5.9 g; and 1-propanol, 5.9 g. The coating solution was coated as in Example 3. Dry weight of the masking layer: about 2.5 g/m².

The resulting imageable element was imaged, developed, and evaluated as in Example 3. The minimum exposure energy to achieve maximum processed density (2.99, black) was about 380 mJ/cm² (see Table below).

| Color | Background[a] | Density Reading at Exposure Values (mJ/cm²) | | | | | | | | |
|---|---|---|---|---|---|---|---|---|---|---|
| | | 146 | 163 | 184 | 211 | 247 | 300 | 379 | 517 | 813 |
| Black | 0.06 | 0.49 | 1.15 | 1.90 | 2.82 | 2.85 | 2.93 | 2.99 | 2.95 | 3.06 |
| Cyan | 0.05 | 0.45 | 1.07 | 1.86 | 2.71 | 2.76 | 2.83 | 2.84 | 2.84 | 2.99 |
| Magenta | 0.06 | 0.51 | 1.14 | 1.87 | 2.52 | 2.53 | 2.58 | 2.60 | 2.60 | 2.68 |
| Yellow | 0.09 | 0.69 | 1.48 | 2.25 | 2.91 | 2.91 | 2.97 | 2.99 | 2.99 | 3.13 |

Example 6

The cover sheet and release layer are removed from a CYREL® flexographic printing plate precursor, type 67HLS, leaving the photosensitive layer as the top layer, overlying a substrate.

The coating solution from Example 5 is applied onto the photosensitive layer using a wire wound Meyer bar following the procedure of Example 5. The coating weight of the resulting masking layer is about 2.5 g/m².

The resulting imageable element is imaged on a CREO® Trendsetter at 380 mJ/cm², using an internal test pattern and is developed as described in Example 3. In the imaged regions of the masking layer, the imageable layer resists water development. The unimaged regions are removed.

The resulting element is given a back flash exposure of 14 sec using a CYREL® 3040 light source, and is then exposed for 2 min without a vacuum through the imaged and developed masking layer. The exposed element is then developed in a CYREL® rotary processor for 6 min using a 3:1 mixture (vol/vol) of perclene and butanol. The masking layer and the unexposed regions of the photosensitive layer are removed to form a relief printing plate. The printing plate is oven dried for 1 hr at 60° C. and is then simultaneously post exposed and finished in a CYREL® light finishing unit for 5 min. On printing with the plate, good images are obtained.

Having described the invention, we now claim the following and their equivalents.

What is claimed is:

1. An imageable element comprising, in order:
   (a) a substrate, and
   (b) a masking layer comprising a radiation absorber and one or more co-polymers selected from the group consisting of co-polymers that comprises sulfobetaine containing side chains, co-polymers that comprise carboxybetaine containing side chains, and co-polymers that comprise sulfobetaine containing side chains and carboxybetaine containing side chains;
   wherein: the radiation absorber comprises one or more materials selected from the group consisting of materials that absorb ultraviolet radiation, photothermal conversion materials, photothermal conversion materials that also absorb ultraviolet radiation, and mixtures thereof; and
   the masking layer absorbs ultraviolet radiation and infrared radiation.

2. The element of claim 1 in which the radiation absorber comprises carbon black.

3. The element of claim 1 in which the one or more co-polymers is selected from the group consisting of co-polymers that comprises carboxybetaine containing side chains.

4. The element of claim 1 in which the one or more co-polymers is selected from the group consisting of co-polymers that comprises sulfobetaine containing side chains.

5. The element of claim 1 in which the one or more co-polymers comprises K units and L units in which:
   the K units are selected from $-[CH_2C(R^1)R^2]-$, $-[CH_2CR^3(CO_2R^4)]-$, $-[CH_2CR^3(CON(R^5)(R^6))]-$, $-[C(R^7)(COECO)C(R^7)]-$, and mixtures thereof;

the L units are selected from —[CH$_2$C(R$^8$)(Q(CH$_2$)$_m$N(CH$_3$)$_2$(CH$_2$)$_n$SO$_3$)]—, —[CH$_2$C(R$^9$)(Q(CH$_2$)$_m$N(CH$_3$)$_2$(CH$_2$)$_n$CO$_2$)]—, and mixtures thereof;

R$^1$, R$^3$, R$^7$, R$^8$, and R$^9$, are each independently hydrogen, methyl, or a mixture thereof;

R$^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;

R$^4$, R$^5$, and R$^6$ are each independently hydrogen, alkyl of one to six carbon atoms, cycloalkyl of one to six carbon atoms, phenyl, or a mixture thereof;

E is oxygen or NR$^{10}$ in which R$^{10}$ is hydrogen, hydroxyl, phenyl, substituted phenyl, alkyl of one to six carbon atoms, benzyl, or a mixture thereof;

each Q is independently CO$_2$, O, CONH, CH$_2$, or a mixture thereof;

m is 1 to 8;

n is 2 to 4; and the ratio of K units to L units is about 99:1 to about 1:99.

6. The element of claim 5 in which:
the K units are selected from —[CH$_2$C(R$^1$)R$^2$]—, —[CH$_2$CR$^3$(CO$_2$R$^4$)]— and mixtures thereof;

R$^2$ is phenyl, cyano, or a mixture thereof;

R$^4$ is methyl;

each Q is independently CO$_2$, CONH, or a mixture thereof;

m is 1 to 4; and the ratio of K units to L units is about 95:5 to about 20:80.

7. The element of claim 6 in which the L units are —[CH$_2$—C(R$^8$)(Q(CH$_2$)$_m$N(CH$_3$)$_2$(CH$_2$)$_n$SO$_3$)]—.

8. The element of claim 6 in which the L units are —[CH$_2$—C(R$^9$)(Q(CH$_2$)$_m$N(CH$_3$)$_2$(CH$_2$)$_n$CO$_2$)]—.

9. The element of claim 1 in which the element additionally comprises a photosensitive layer between the substrate and the masking layer, and the substrate is a flexible substrate.

10. The element of claim 9 in which the photosensitive layer comprises a negative working photosensitive composition.

11. The element of claim 10 in which the negative working photosensitive composition is a photopolymerizable composition.

12. The element of claim 11 in which the photosensitive layer is at least 0.25 cm thick.

13. The element of claim 12 in which the one or more co-polymers comprises K units and L units in which:
the K units are selected from —[CH$_2$C(R$^1$)R$^2$]—,—[CH$_2$CR$^3$(CO$_2$R$^4$)]—, —[CH$_2$CR$^3$(CON(R$^5$)(R$^6$))]—, —[C(R$^7$)(COECO)C(R$^7$)]—, and mixtures thereof;

the L units are selected from —[CH$_2$C(R$^8$)(Q(CH$_2$)$_m$N(CH$_3$)$_2$(CH$_2$)$_n$SO$_3$)]—, —[CH$_2$C(R$^9$)(Q(CH$_2$)$_m$N(CH$_3$)$_2$(CH$_2$)$_n$CO$_2$)]—, and mixtures thereof;

R$^1$, R$^3$, R$^7$, R$^8$, and R$^9$, are each independently hydrogen, methyl, or a mixture thereof;

R$^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;

R$^4$, R$^5$, and R$^6$ are each independently hydrogen, alkyl of one to six carbon atoms, cycloalkyl of one to six carbon atoms, phenyl, or a mixture thereof;

E is oxygen or NR$^{10}$ in which R$^{10}$ is hydrogen, hydroxyl, phenyl, substituted phenyl, alkyl of one to six carbon atoms, benzyl, or a mixture thereof;

each Q is independently CO$_2$, O, CONH, CH$_2$, or a mixture thereof;

m is 1 to 8;

n is 2 to 4; and the ratio of K units to L units is about 99:1 to about 1:99.

14. The element of claim 13 in which:
the K units are selected from —[CH$_2$C(R$^1$)R$^2$]—, —[CH$_2$CR$^3$(CO$_2$R$^4$)]— and mixtures thereof;

R$^2$ is phenyl, cyano, or a mixture thereof;

R$^4$ is methyl;

each Q is independently CO$_2$, CONH, or a mixture thereof;

m is 1 to 4; and the ratio of K units to L units is about 95:5 to about 20:80.

15. The element of claim 14 in which the L units are —[CH$_2$—C(R$^8$)(Q(CH$_2$)$_m$N(CH$_3$)$_2$(CH$_2$)$_n$SO$_3$)]—.

16. The element of claim 14 in which the L units are —[CH$_2$—C(R$^9$)(Q(CH$_2$)$_m$N(CH$_3$)$_2$(CH$_2$)$_n$CO$_2$)]—.

17. A method for forming an image, the method comprising the steps of:

(A) providing an imageable element, the imageable element comprising, in order:
(i) a flexible substrate,
(ii) a photosensitive layer, and
(iii) a masking layer comprising a radiation absorber and one or more co-polymers selected from the group consisting of co-polymers that comprises sulfobetaine containing side chains, co-polymers that comprise carboxybetaine containing side chains, and co-polymers that comprise sulfobetaine containing side chains and carboxybetaine containing side chains; in which:
the radiation absorber comprises one or more materials selected from the group consisting of materials that absorb ultraviolet radiation, photothermal conversion materials, photothermal conversion materials that also absorb ultraviolet radiation, and mixtures thereof; and
the masking layer absorbs ultraviolet radiation and infrared radiation;

(B) thermally imaging the masking layer and forming an imaged masking layer comprising imaged regions and complementary unimaged regions in the imageable layer;

(C) forming a photomask by developing the imaged masking layer and removing the unimaged regions;

(D) overall exposing the imageable element with ultraviolet radiation through the photomask and forming an imaged imageable element comprising imaged and complementary unimaged regions in the photosensitive layer;

(E) removing the photomask; and (F) developing the imaged imageable element and forming the image by removing one of the imaged regions and the unimaged regions;

in which steps (E) and (F) can be carried out at the same time.

18. The method of claim 17 in which the photosensitive layer comprises a photopolymerizable composition and developing removes the unimaged regions.

19. The method of claim 17 in which the one or more co-polymers comprises K units and L units in which:
the K units are selected from —[CH$_2$C(R$^1$)R$^2$]—, —[CH$_2$CR$^3$(CO$_2$R$^4$)]—, —[CH$_2$CR$^3$(CON(R$^5$)(R$^6$))]—, —[C(R$^7$)(COECO)C(R$^7$)]—, and mixtures thereof;

the L units are selected from —[CH$_2$C(R$^8$)(Q(CH$_2$)$_m$N(CH$_3$)$_2$(CH$_2$)$_n$SO$_3$)]—, —[CH$_2$C(R$^9$)(Q(CH$_2$)$_m$N(CH$_3$)$_2$(CH$_2$)$_n$CO$_2$)]—, and mixtures thereof;

R$^1$, R$^3$, R$^7$, R$^8$, and R$^9$, are each independently hydrogen, methyl, or a mixture thereof;

$R^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;

$R^4$, $R^5$, and $R^6$ are each independently hydrogen, alkyl of one to six carbon atoms, cycloalkyl of one to six carbon atoms, phenyl, or a mixture thereof;

E is oxygen or $NR^{10}$ in which $R^{10}$ is hydrogen, hydroxyl, phenyl, substituted phenyl, alkyl of one to six carbon atoms, benzyl, or a mixture thereof;

each Q is independently $CO_2$, O, CONH, $CH_2$, or a mixture thereof;

m is 1 to 8;

n is 2 to 4; and the ratio of K units to L units is about 99:1 to about 1:99.

20. The method of claim 19 in which the photosensitive layer comprises a photopolymerizable composition and developing removes the unimaged regions.

21. The method of claim 20 in which:
the K units are selected from $—[CH_2C(R^1)R^2]—$, $—[CH_2CR^3(CO_2R^4)]—$ and mixtures thereof;
$R^2$ is phenyl, cyano, or a mixture thereof;
$R^4$ is methyl;
each Q is independently is $CO_2$, CONH, or a mixture thereof;
m is 1 to 4; and
the ratio of K units to L units is about 95:5 to about 20:80.

22. The method of claim 21 in which the photosensitive layer is at least 0.25 cm thick.

23. The method of claim 22 in which the L units are $—[CH_2—C(R^8)(Q(CH_2)_mN(CH_3)_2(CH_2)_nSO_3)]—$.

24. The element of claim 22 in which the L units are $—[CH_2—C(R^9)(Q(CH_2)_mN(CH_3)_2(CH_2)_nCO_2)]—$.

25. A method for forming an image, the method comprising the steps of:
(A) providing a first imageable element, the first imageable element comprising, in order:
a first substrate, and
a masking layer comprising a radiation absorber and one or more co-polymers selected from the group consisting of co-polymers that comprises sulfobetaine containing side chains, co-polymers that comprise carboxybetaine containing side chains, and co-polymers that comprise sulfobetaine containing side chains and carboxybetaine containing side chains on the first substrate;
in which:
the radiation absorber comprises one or more materials selected from the group consisting of materials that absorb ultraviolet radiation, photothermal conversion materials, photothermal conversion materials that also absorb ultraviolet radiation, and mixtures thereof;
the first substrate transmits ultraviolet radiation; and the masking layer absorbs ultraviolet radiation and infrared radiation,
(B) thermally imaging the masking layer and forming an imaged masking layer comprising imaged regions and complementary unimaged regions;
(C) forming a photomask by developing the imaged masking layer and removing the unimaged regions;
(D) providing a second imageable element, the second imageable element comprising, in order:
a second substrate; and
a photosensitive layer over the second substrate;
(E) overall exposing the photosensitive layer with ultraviolet radiation through the photomask and forming an imaged second imageable element in which the photosensitive layer comprises imaged and complementary unimaged regions;
(F) removing the photomask; and
(G) developing the imaged second imageable element and forming the image by removing one of the imaged regions and the unimaged regions.

26. The method of claim 25 in which the photosensitive layer comprises a photopolymerizable composition and developing removes the unimaged regions.

27. The method of claim 25 in which the one or more co-polymers comprises K units and L units in which:
the K units are selected from $—[CH_2C(R^1)R^2]—$, $—[CH_2CR^3(CO_2R^4)]—$, $—[CH_2CR^3(CON(R^5)(R^6))]—$, $—[C(R^7)(COECO)C(R^7)]—$, and mixtures thereof;
the L units are selected from $—[CH_2C(R^8)(Q(CH_2)_mN(CH_3)_2(CH_2)_nSO_3)]—$, $—[CH_2C(R^9)(Q(CH_2)_mN(CH_3)_2(CH_2)_nCO_2)]—$, and mixtures thereof;
$R^1$, $R^3$, $R^7$, $R^8$, and $R^9$, are each independently hydrogen, methyl, or a mixture thereof;
$R^2$ is hydrogen, methyl, phenyl, substituted phenyl, halogen, cyano, alkoxy of one to four carbon atoms, acyl of one to five carbon atoms, acyloxy of one to five carbon atoms, vinyl, allyl, or a mixture thereof;
$R^4$, $R^5$, and $R^6$ are each independently hydrogen, alkyl of one to six carbon atoms, cycloalkyl of one to six carbon atoms, phenyl, or a mixture thereof;
E is oxygen or $NR^{10}$ in which $R^{10}$ is hydrogen, hydroxyl, phenyl, substituted phenyl, alkyl of one to six carbon atoms, benzyl, or a mixture thereof;
each Q is independently $CO_2$, O, CONH, $CH_2$, or a mixture thereof;
m is 1 to 8;
n is 2 to 4; and
the ratio of K units to L units is about 99:1 to about 1:99.

28. The method of claim 27 in which the photosensitive layer comprises a photopolymerizable composition and developing removes the unimaged regions.

29. The method of claim 28 in which:
the K units are selected from $—[CH_2C(R^1)R^2]—$, $—[CH_2CR^3(CO_2R^4)]—$ and mixtures thereof;
$R^2$ is phenyl, cyano, or a mixture thereof;
$R^4$ is methyl;
each Q is independently is $CO_2$, CONH, or a mixture thereof; m is 1 to 4; and
the ratio of K units to L units is about 95:5 to about 20:80.

30. The method of claim 29 in which the photosensitive layer is at least 0.25 cm thick.

31. The method of claim 30 in which the L units are $—[CH_2—C(R^8)(Q(CH_2)_mN(CH_3)_2(CH_2)_nSO_3)]—$.

32. The element of claim 30 in which the L units are $—[CH_2—C(R^9)(Q(CH_2)_mN(CH_3)_2(CH_2)_nCO_2)]—$.

* * * * *